US011550041B2

(12) United States Patent
Kashmiri

(10) Patent No.: US 11,550,041 B2
(45) Date of Patent: Jan. 10, 2023

(54) CURRENT-DOMAIN ANALOG FRONTEND FOR INTENSITY MODULATED DIRECT TIME-OF-FLIGHT LIDARS

(71) Applicant: Robert Bosch GmbH, Stuttgart (DE)

(72) Inventor: Sayyed Mahdi Kashmiri, Sunnyvale, CA (US)

(73) Assignee: ROBERT BOSCH GMBH

( * ) Notice: Subject to any disclaimer, the term of this patent is extended or adjusted under 35 U.S.C. 154(b) by 526 days.

(21) Appl. No.: 16/698,577

(22) Filed: Nov. 27, 2019

(65) Prior Publication Data

US 2021/0156974 A1    May 27, 2021

(51) Int. Cl.
| | |
|---|---|
| *H03F 3/08* | (2006.01) |
| *G01S 7/4861* | (2020.01) |
| *H03F 3/21* | (2006.01) |
| *H03F 1/02* | (2006.01) |
| *H03F 1/34* | (2006.01) |
| *G01S 17/08* | (2006.01) |

(52) U.S. Cl.
CPC ............ *G01S 7/4861* (2013.01); *G01S 17/08* (2013.01); *H03F 1/0211* (2013.01); *H03F 1/342* (2013.01); *H03F 3/21* (2013.01); *H03F 2200/129* (2013.01); *H03F 2200/144* (2013.01); *H03F 2200/228* (2013.01); *H03F 2200/456* (2013.01)

(58) Field of Classification Search
CPC ........................................................ H03F 3/08
USPC ...................................... 330/308; 250/214 A
See application file for complete search history.

(56) References Cited

FOREIGN PATENT DOCUMENTS

WO    2019149688 A1    8/2019

OTHER PUBLICATIONS

Ma et al., "A 66-dB Linear Dynamic Range, 100-dB Transimpedance Gain TIA With High-Speed PDSH for LiDAR", IEEE Transactions on Instrumentation and Measurement, vol. 69, No. 4, Apr. 2020, 4 pages.
Salvia et al., "A 56MQ CMOS TIA for MEMS Applications", IEEE 2009 Custom Intergrated Circuits Conference (CICC), 4 pages.
Sedra et al., "The current conveyor: history, progress and new results", IEE Proceedings, vol. 137, Pt. G, No. 2, Apr. 1990, 10 pages.
David Guidry, "LIDAR-Pulsed Time-of-Flight Reference Design Using High-Speed Data Converters", TI Designs: TIDA-01187, 2017, Texas, 29 pages.
Behzad Razavi, "A 622 Mb/s 4.5 pA/Hz CMOS transimpedance amplifier", IEEE international Solid-State Circuits Conference, Feb. 2000, California, 10 pages.

(Continued)

*Primary Examiner* — Henry Choe
(74) *Attorney, Agent, or Firm* — Dickinson Wright PLLC

(57) ABSTRACT

A circuit for filtering a signal corresponding to a time of flight (TOF) of light from a laser reflected off an object to a photo detector, the circuit includes a preamplifier, a DC cancelation loop, and an AC cancelation loop. The preamplifier may be configured to receive the signal from the photo detector corresponding to an output of the laser reflected off an object remote from the laser and photo detector. The DC cancelation loop includes a current feedback DC servo loop. The AC cancelation loop includes a feedback network driven by a floating class AB output stage, and the preamplifier configured to drive the floating class AB output stage, wherein the preamplifier is driven by an error signal of the feedback network and creates an AC signal path with the feedback network and floating class AB output stage.

18 Claims, 12 Drawing Sheets

(56) References Cited

OTHER PUBLICATIONS

Sackinger, "Broadband Circuits for Optical Fiber Communication", Wiley, 2005, 453 pages.
Yoshioka, et al. "A 20-ch TDC/ADC Hybrid Architecture LiDAR SoC for 240x96 Pixel 200-m Range Imaging With Smart Accumulation Technique and Residue Quantizing SAR ADC," IEEE Journal of solid-state circuits, vol. 53—issue 11, Sep. 2018, 14 pages.

CURRENT-DOMAIN ANALOG FRONTEND FOR INTENSITY MODULATED DIRECT TIME-OF-FLIGHT LIDARS

TECHNICAL FIELD

This invention relates generally to a current-domain analog frontend circuit for intensity modulated direct time of flight LIDAR.

BACKGROUND

The transmission and receive scheme of light detection and ranging (LIDAR) systems have various categories, ranging from continuous-wave frequency or intensity modulated systems which measure range by means of phase or frequency measurements, to direct time-of-flight systems where the travel time of a transmitted laser pulse is measured. State-of-the-art long range automotive Lidars usually incorporate a direct time-of-flight single-pulse scheme, which is in line with eye safe operation of the laser requiring limitation on the transmitted laser energy.

Automotive LIDAR systems with the long-range requirements (>200 meters) at low object reflectivity (~10 to 20%) need to be made eye-safe. The reflected optical signal's power is reduced quadratically by distance and linearly by the reflectivity of the object, which can easily translate to dynamic range in the order of 90 dB. To maximize range, the transmitted laser pulse needs to have very large peak optical power, on the order of many tens of watts. Eye-safe operation requires the average power to be maintained at the maximum permissible level by the standards, which requires the reduction of the pulse-width of the light signal to a few nano-seconds. This provides the best performance in terms of the achieved range, but imposes system challenges for the Lidar hardware implementation that contribute to cost and complexity. The driver of the laser light source needs to deliver a large amount of power to the laser in a very short time with fast switching time, usually requiring the development of special high-speed power semiconductor components, such as components using Gallium Nitride technology. Furthermore, the receive chain to measure time of flight (TOF) needs to deal with a large dynamic range imposed by the long distance and object reflectivity range.

SUMMARY

A current-domain analog frontend (AFE) circuit for a LIDAR system includes a photo detector configured to source a current, a current feedback DC servo loop configured to cancel a DC component of the current, a feedback network configured to cancel an AC component of the current, a floating class AB output stage that drives the feedback network, and a preamplifier. The preamplifier may be configured to drive the floating class AB output stage, wherein the preamplifer is driven by an error signal of the feedback network and creates an AC signal path with the feedback network and floating class AB output stage.

A method of operating a LIDAR system includes sourcing a current via a photo detector, canceling a DC component of the current via a current feedback DC servo loop, canceling an AC component of the current via a feedback network, driving the feedback network via a floating class AB output stage; and driving the floating class AB output stage via a preamplifier, wherein the preamplifier is driven by an error signal of the feedback network.

A circuit for filtering a signal corresponding to a time of flight (TOF) of light from a laser reflected off an object to a photo detector, the circuit includes a preamplifier, a DC cancelation loop, and an AC cancelation loop. The preamplifier may be configured to receive the signal from the photo detector corresponding to an output of the laser reflected off an object remote from the laser and photo detector. The DC cancelation loop includes a current feedback DC servo loop. The AC cancelation loop includes a feedback network driven by a floating class AB output stage, and the preamplifier configured to drive the floating class AB output stage, wherein the preamplifier is driven by an error signal of the feedback network and creates an AC signal path with the feedback network and floating class AB output stage.

DETAILED DESCRIPTION

Figure 1:
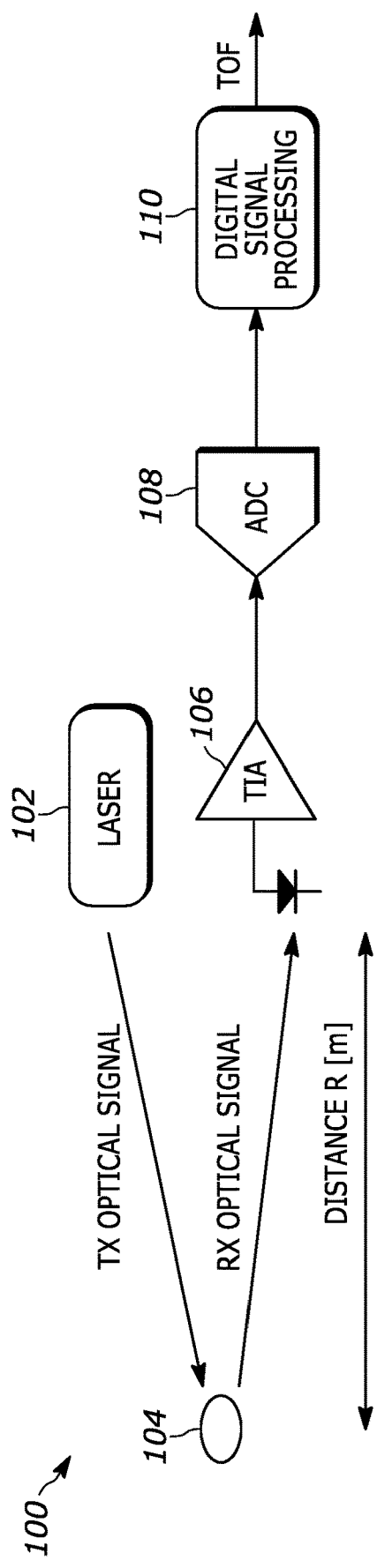
FIG. 1 is a block diagram illustrating a direct time-of-flight (dTOF) signal path.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

Lidar is a sensor that can be used for ranging in applications such as autonomous driving, robotics, etc. It measures distances optically, for instance by transmitting a laser light pulse and measuring the time it takes for the light to bounce off a target (direct time-of-flight or dTOF approach). One of the challenges of such Lidar systems is associated with their receive signal path electronics that should detect the light reflected from far distances object (i.e. >200 m) with limited reflectivity (dark objects). This imposes several requirements on the noise performance, dynamic range and bandwidth of the receive signal path. The current state-of-the art dTOF LIDAR's often pass the output current of their photodetectors (light transducers) to a trans-impedance amplifier (TIA), whose output voltage is then processed by a high-speed and high-resolution Analog-to-Digital Converter (ADC). A TIA design has orthogonal performance trade-offs among bandwidth and stability on the one hand and noise performance on the other hand. This often makes the TIA the dominant noise source in the Lidar receiver signal path if high bandwidths are desired, limiting the overall link SNR and hence its range performance. Furthermore, TIA's have limitations in fast saturation recovery (e.g. when processing signals from near to mid-range), which makes their use limited for alternative modulation techniques other than the often used single pulse transmission schemes, (e.g used with phase coded bursts similar to that disclosed in PCT/EP2019/052094).

This application discloures a current-domain analog frontend circuit (Current AFE) to be used for automotive LIDAR's that addresses the above challenges of the TIA based systems. It allows alternative trade-offs other than those of a TIA design space (i.e. decoupling of input noise and bandwidth) and optimizes the noise and recovery speed for the high dynamic range and high speed needs of the automotive Lidar. Furthermore, the current-domain signal path allows the use of current-domain ADC's that can be better optimized for high oversampling ratios, especially suitable for alternative modulation schemes such as the intensity modulation phase-coded bursts.

One of the challenges of the automotive Lidar sensors (laser range finders) is reaching the required performance in range and resolution with the permissible eye-safe laser energy levels. Among the possible Lidar modulation techniques, direct time-of-flight (dTOF) is one of the methods that can achieve these requirements. Currently, the state-of-the art dTOF systems (FIGS. 1 and 2) transmit a single laser pulse with high power (~>100 Watts) and narrow width (~<5 nano-seconds) and measure the time it takes for light to bounce off a target, which is proportional to range through the speed of light. The often used detection paths involve a photo detector such as an avalanche photodiode (APD) producing an output current, a trans-impedance amplifier (TIA) to translate the photodiode current to an output voltage and a time-to-digital or an analog-to-digital converter (TDC or ADC) to digitize the signal for further processing.

FIG. 1 is a block diagram illustrating a direct time-of-flight (dTOF) signal path 100. A laser 102 transmits an optical signal to on object 104 which is then received by a photo detector such as a photodiode. The signal is then amplified by a trans-impedance amplifier (TIA) 206 and converted to a digital signal via an analog to digital converter (ADC) 108 which then may be operated upon via a processor 110 (e.g., a digital signal processor (DSP)) outputting a Time of Flight (TOF) signal.

Figure 2:
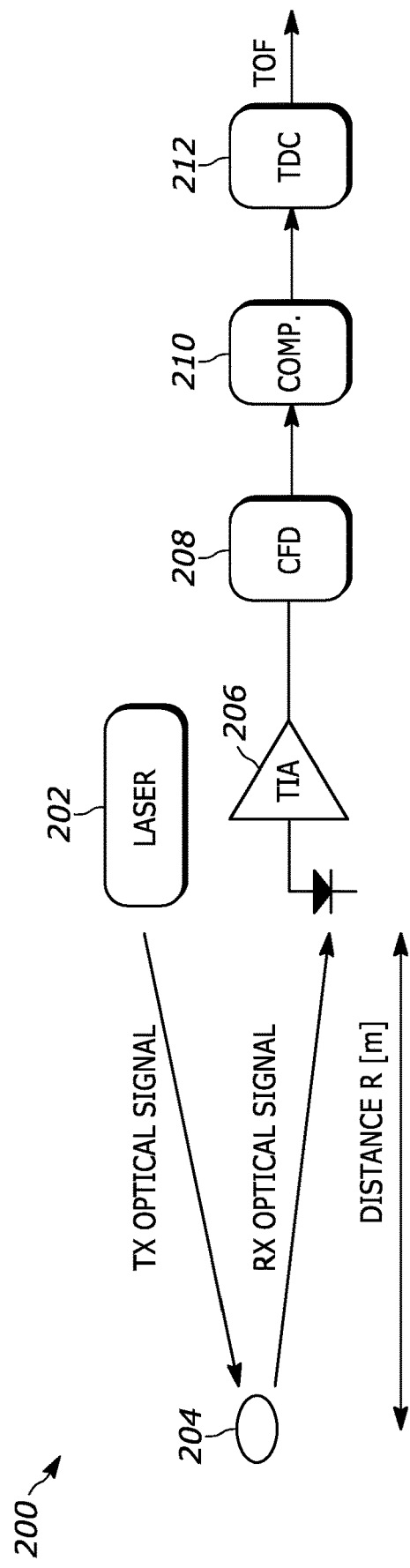
FIG. 2 is a block diagram illustrating an alternative direct time-of-flight (dTOF) signal path.

FIG. 2 is a block diagram illustrating an alternative direct time-of-flight (dTOF) signal path 200. A laser 202 transmits an optical signal to on object 204 which is then received by a photo detector such as a photodiode. The signal is then amplified by a trans-impedance amplifier (TIA) 206 and forwarded to a constant fraction discriminator (CFD) 208 then on to a comparator 210 and a time to digital converter (TDC) 212 that then outputs a Time of Flight (TOF) signal.

Figure 3:
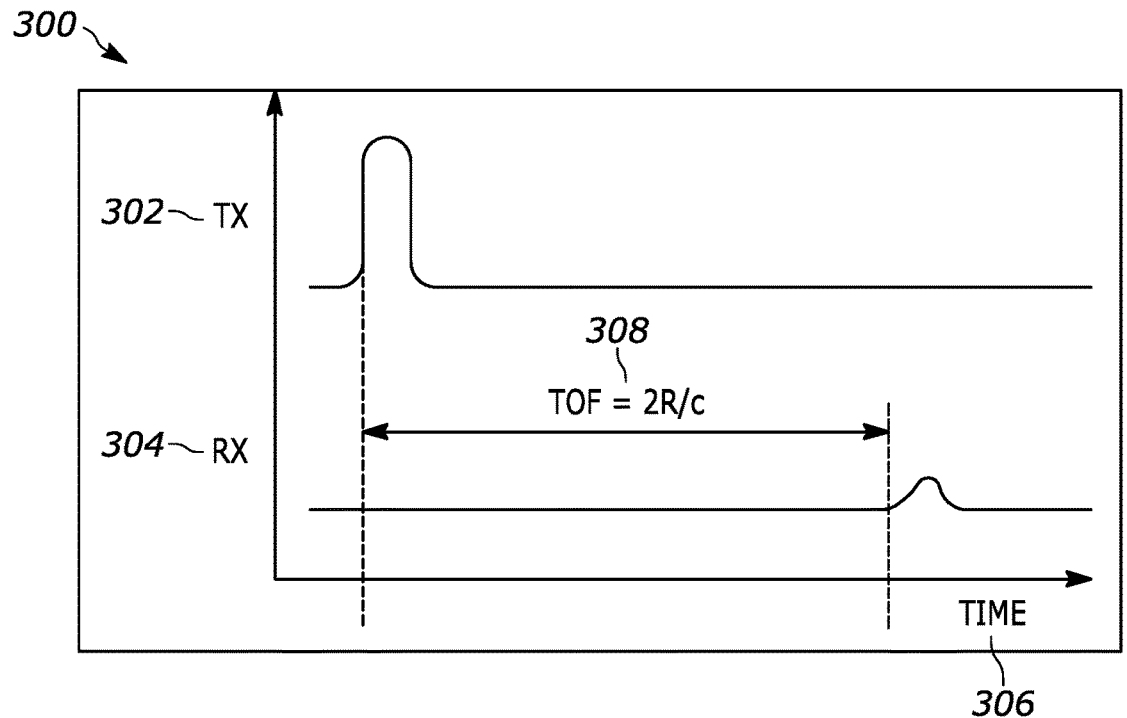
FIG. 3 is a graphical representation of the relationship of amplitude to time of a signal of FIG. 1 or FIG. 2.

FIG. 3 is a graphical representation 300 of the relationship of transmit amplitude 302 and receive amplitude 304 with respect to time 306 of signals of FIG. 1 or FIG. 2.

For this approach, improved Lidar performance, is obtained by minimizing the input referred noise and maximizing the bandwidth of the TIA. Unfortunately this is difficult to do with TIAs as their input noise and bandwidth are fundamentally coupled. i.e. they are dependent and proportional to one another. In fact to increase a TIAs bandwidth one must increase its input noise and vice versa. This dependency/relationship between TIA bandwidth and input noise is exactly the opposite of what one would desire in order to maximize performance of a Lidar analog front-end and it often makes the TIA one of the dominate performance limiters in the Lidar system. Furthermore, TIA circuits have difficulty recovering from saturation for large inputs and as such usually their outputs are clipped for near to mid-range reflections. For a single-pulse transmission scheme where the arrival time can be resolved as long as the rising edge of the signal can be detected the saturation issue could be of less importance, however, this limitation prohibits the system designers from higher level trade-offs for instance by choosing lower peak transmission powers and resorting the system performance in the backend through matched filter and cross correlation techniques similar to that disclosed in PCT/EP2019/052094.

Figure 4:
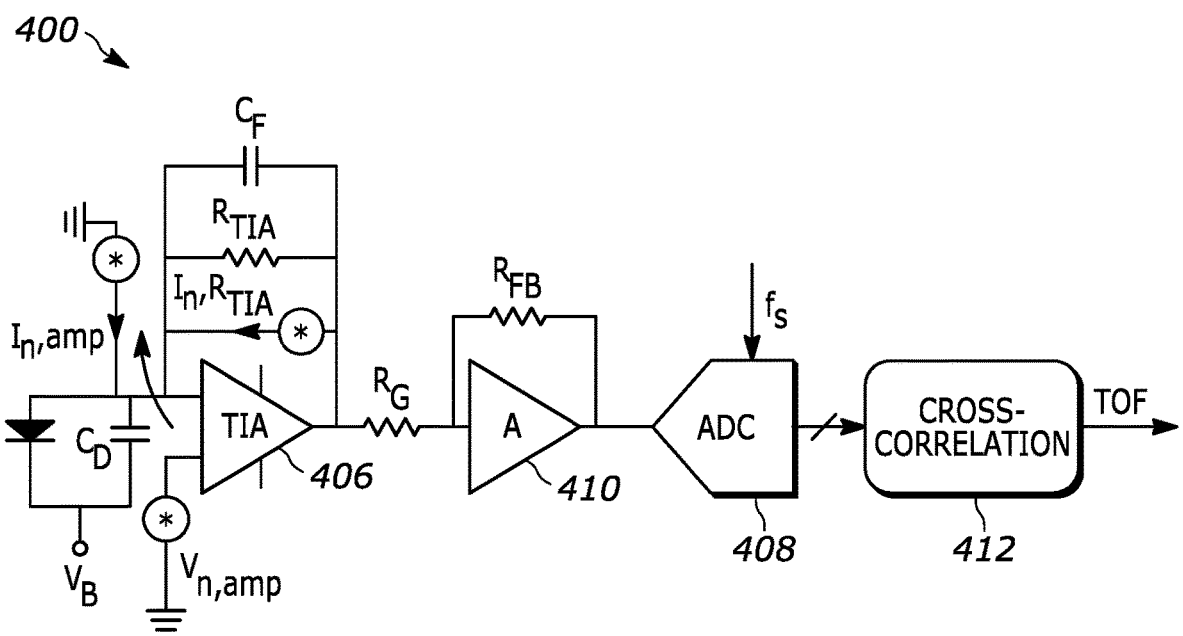
FIG. 4 is a block diagram illustrating a circuit of a direct time-of-flight (dTOF) signal path including a trans-impedance amplifier (TIA), an intermediate amplifier, an analog to digital converter (ADC) and a digital signal processor.

FIG. 4 is a block diagram illustrating a trans-impedance amplifier (TIA) circuit of a direct time-of-flight (dTOF) signal path 400. A signal from a photo detector such as a photodiode is amplified by a trans-impedance amplifier (TIA) 406 that is then amplified by an amplifier 410 and converted to a digital signal via an analog to digital converter (ADC) 408 which then may be operated upon via a processor 412 (e.g., a digital signal processor (DSP)) by cross-correlation of the digital signal and outputting a Time of Flight (TOF) signal.

FIG. 4 illustrates a TIA based dTOF Lidar signal path used in the current state of the art implementations. An intermediate gain stage is usually needed to gain up the signal for the far end of the range. The TIA's performance and the design criteria is affected by several contributors: The parasitic input capacitance $C_D$ is one of the items (e.g. caused by the photodiode and amplifier), which affects the amplifier's stability negatively. To compensate for that a feedback capacitance $C_F$ is added. This stability requirement boils down to a design criteria where the 3 dB bandwidth of the signal path, $f_{BW}$, the unity gain frequency of the TIA amplifier $f_U$, the trans-impedance factor, $R_{TIA}$ and the capacitors will all be related as shown by the frequency response plot of FIG. 5. This illustrates the amplifier open loop gain and the noise gain of the TIA (inverse feedback factor or 1/β). The difference between the two, forms the loop-gain of the feedback network (Aβ), where stability criterion requires a 20 dB/dec crossing slope when passing through the unity gain frequency. The noise gain after adding the compensation capacitor can be written as:

$$\frac{1}{\beta} = \frac{1 + sR_{TIA}(C_F + C_D)}{1 + sR_{TIA}C_F} \quad (1)$$

Figure 5:
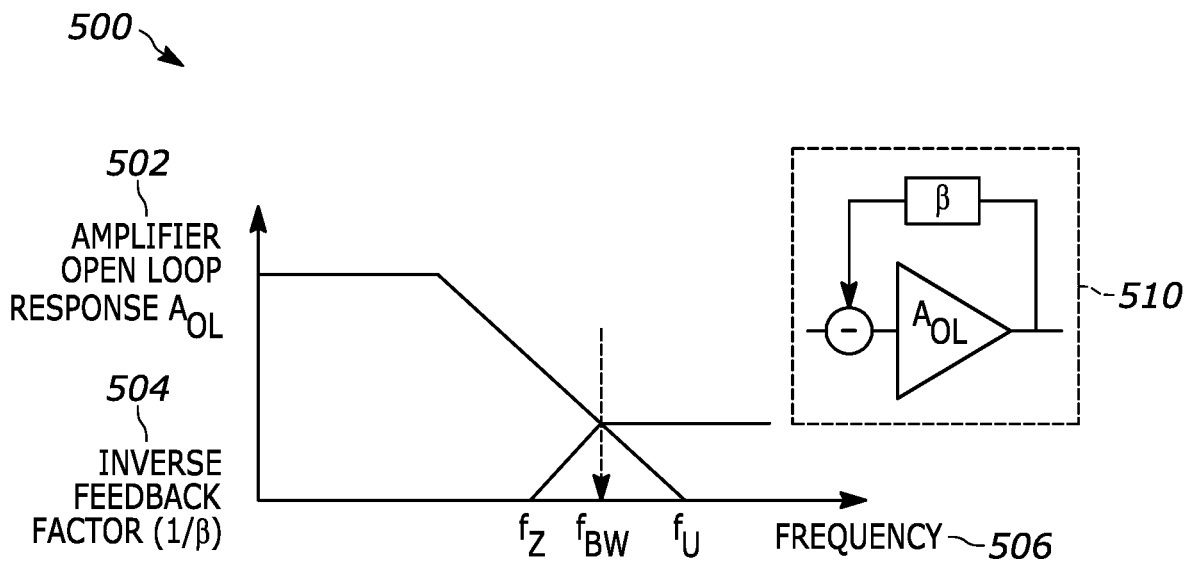
FIG. 5 is a graphical representation of the relationship of amplitude with respect to frequency of an open loop TIA amplifier and a TIA amplifier with a 1/β feedback factor.

As shown in FIG. 5 this characteristic has a zero (denoted by $f_z$) due to the parasitic capacitance and a pole (denoted by $f_{BW}$) that we choose by selecting the value for the stabilization capacitor $C_F$:

$$f_z = \frac{1}{R_{TIA}(C_F + C_D)} \sim \frac{1}{R_{TIA}C_D}(C_D \gg C_F) \quad (2)$$

$$f_{BW} = \frac{1}{R_{TIA}C_F} \quad (3)$$

For a Butterworth response (Q=0.7) one can choose to have the closed loop bandwidth, which will be $f_{BW}$, as the geometrical mean of the unity gain frequency and the introduced zero by $C_D$:

$$f_{BW} = \sqrt{f_z \times f_U} \rightarrow \frac{1}{R_{TIA}C_F} = \sqrt{\frac{1}{R_{TIA}C_D} \times f_U} \quad (4)$$

FIG. 5 is a graphical representation of the relationship of amplifier open loop response amplitude 502 and inverse feedback amplitude 504 with respect to frequency 506 of an open loop TIA amplifier and a TIA amplifier with a 1/β feedback factor 510.

Therefore, the TIA design trade-offs can take one of two paths Bandwidth sets the noise (e.g., SNR) or the noise (e.g., SNR) sets the bandwidth.

In the case of the bandwidth setting the noise (SNR), either the application, e.g. the dTOF Lidar transmitted pulse-width, which is determined by available eye-safe laser energy and the required range specification, fixes the required bandwidth $f_{BW}$, and the photodiode fixes the parasitic capacitance $C_D$ and the Lidar link SNR budget determines the feedback resistor $R_{TIA}$ based on noise requirements (assuming that in a balanced TIA design the $R_{TIA}$ is the dominant noise source). This fixes the choice for the required unity gain bandwidth $f_U$ of the amplifier that becomes a technology limitation.

In the case of the noise (e.g., SNR) setting the bandwidth, the link SNR fixes the noise (and hence $R_{TIA}$) and the capability of the technology fixes the unity gain bandwidth of the amplifier, $f_U$, and together with the given photodiode parasitic capacitance this will result in a maximum achievable bandwidth. In a way this will translate back to a limitation for the Lidar range as with fixed laser energy the range performance has now to be compromised by reducing the laser peak transmission power.

As can be observed from the above trade-offs, current noise is improved by larger $R_{TIA}$ but that comes at the cost of reduced BW, which can be limited by the available technology speed. Finally, it is also worth noting that in regard with the ultimate noise performance of the resistive TIA, we also have the contribution of the amplifier noise Vn (in addition to the current noise by $R_{TIA}$), showing up at the input as an input referred current noise through the input parasitic capacitance, as well as the compensation capacitance:

$$I_{n,amp}^2 = V_{n,amp}^2 \left( \frac{1}{R_{TIA}^2} + \omega^2(C_D + C_F)^2 \right) \quad (5)$$

This shows that in a resistive TIA, the parasitic capacitance not only sets a limitation to noise performance due to its effect on the $R_{TIA}$ value (for stable operation), but also creates a noise-gain through which the voltage noise of the amplifier is turned into an input referred current noise.

Another challenge associated with the current state-of-the-art dTOF is the need for very high-speed and high resolution ADCs that are required to produce a few samples for the duration of the time the reflection of the narrow laser pulse can be observed. This is mainly because there are only a few samples of the pulse (2 to 5 nano-second) available per shot and hence the ADC quantization noise negatively affects the accuracy at which the pulse arrival time can be estimated. This can be seen as an oversampling ratio limitation, where bandwidth is determined by pulse width (larger bandwidth for narrower pulses). Oversampling ratio and quantization noise could be traded off if the noise-bandwidth could be reduced and potentially the sampling rate could be increased, allowing for more relaxed ADC resolution.

A method of improving the above could be assumed to differentiate from the single narrow transmit pulse scheme used in the current approaches, however, given a fixed available eye safe energy, only reducing the pulse amplitude and extending it in time (to maintain energy but reduce noise bandwidth and help increase oversampling ratio) will result in a fundamental loss of SNR due to deterioration of the pulse autocorrelation peak slew rate. This could be potentially addressed by using specific phase coding in a train of pulses (a burst) in order to implement an auto-correlation function with maximized peak slew rate similar to that disclosed in PCT/EP2019/052094. This could be imagined for instance as a train of 10 pulses in contrast to a single pulse, each at 10 times lower peak amplitude compared to the single pulse and at the same pulse-width but with a certain phase shift keying implemented in them. This could result in the use of even single-bit ADCs to estimate time of flight similar to that disclosure in PCT/EP2019/052094. Using such coded schemes with reduced peak transmit power is specifically attractive as it reduces cost and complexity of the system.

An issue associated with TIA based frontends is that their trans-impedance is usually optimized for far range SNR requirements, which means the TIA will saturate and clip for short to mid-range signals (4 orders of magnitude dynamic range can be assumed for automotive Lidar). This has several limitations. One is that the TIA's recovery time from saturation is usually much slower than the modulation periods that are suitable for phase coded Lidar transmissions. This will disrupt the phase coding and deteriorates the burst's auto-correlation function. Furthermore, the clipped TIA does not allow the measurement of the reflected signal energy, which is desired for object classification.

Figure 6:
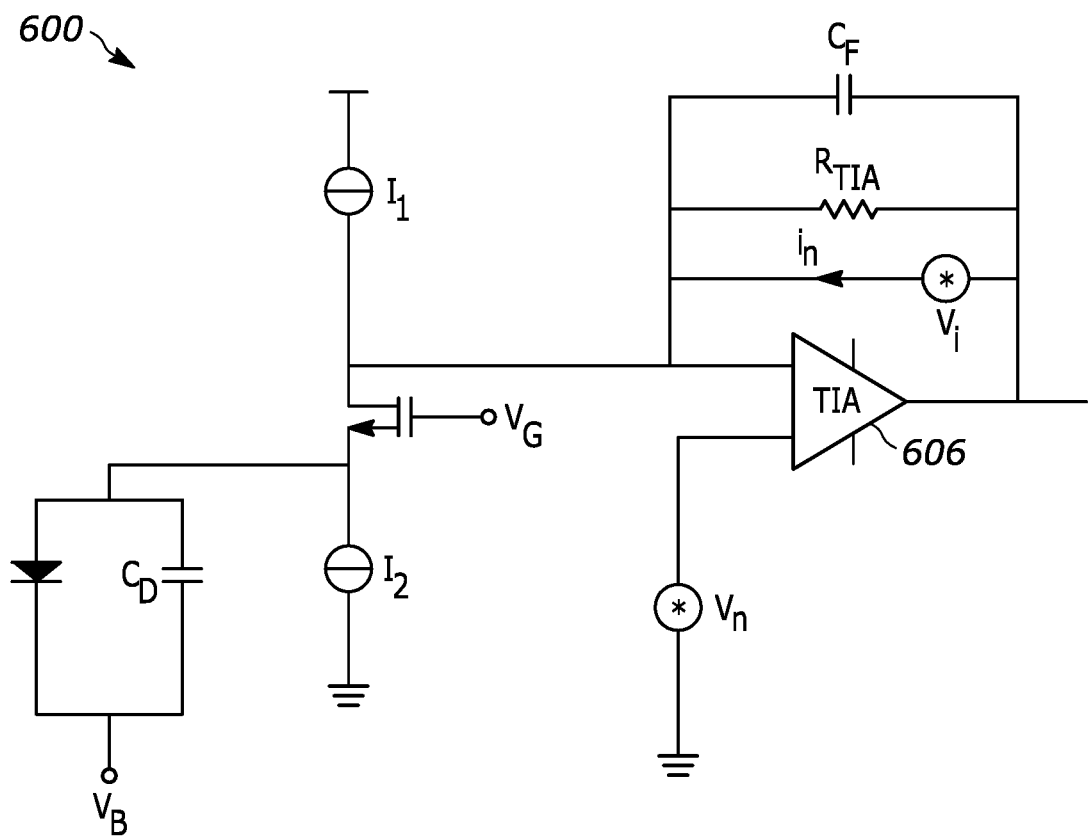
FIG. 6 is schematic diagram of a common gate input buffer and a TIA.
Figure 7:
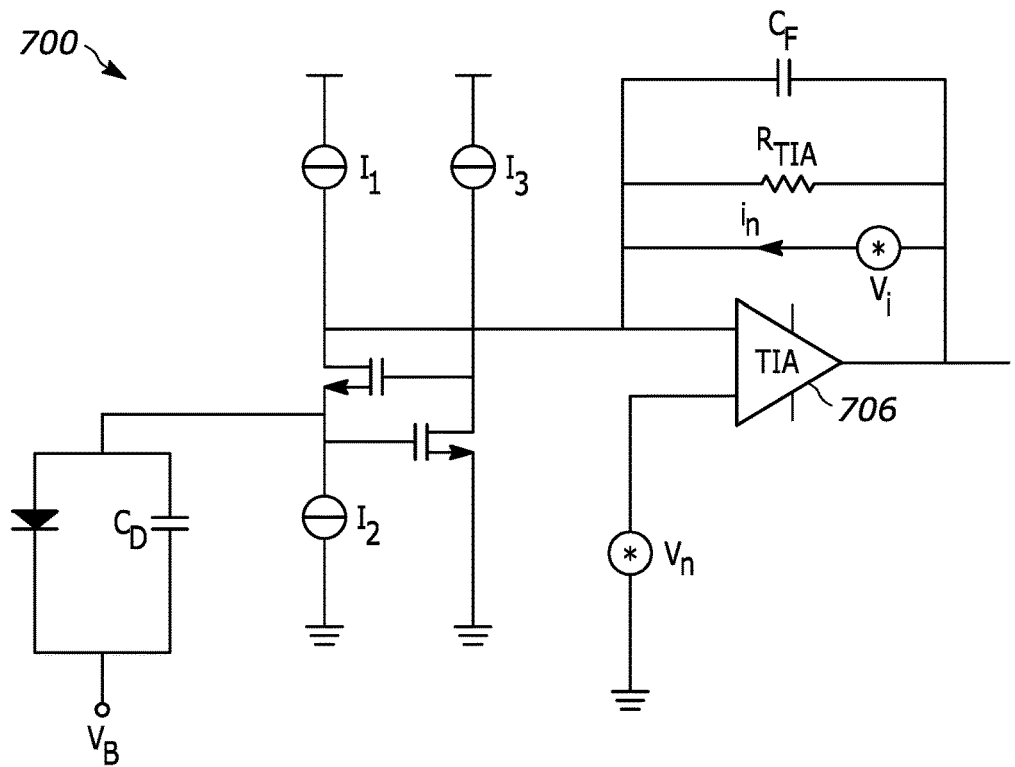
FIG. 7 is schematic diagram of a regulated common gate input buffer and a TIA.

In addition to the TIA structures described above, there are TIA's introduced in prior art, which incorporate a common-gate input current buffer or a regulated common-gate input current buffer before the resistive TIA. These are aimed at decoupling the photodiode capacitance and TIA's feedback resistor trade-offs (e.g. as shown in FIGS. 6 and 7) with benefits for stability and noise gain of $C_D$. These structures, however, have the drawback of additional noise due to the channel noise of the common-gate transistor and the regulating loop. Furthermore, the clipping and saturation issues discussed earlier remain unaddressed with these approaches.

FIG. 6 is schematic diagram of a common gate input buffer 600 that includes a trans-impedance amplifier (TIA) 606. FIG. 7 is schematic diagram of a regulated common gate input buffer that includes a trans-impedance amplifier (TIA) 706.

Figure 8:
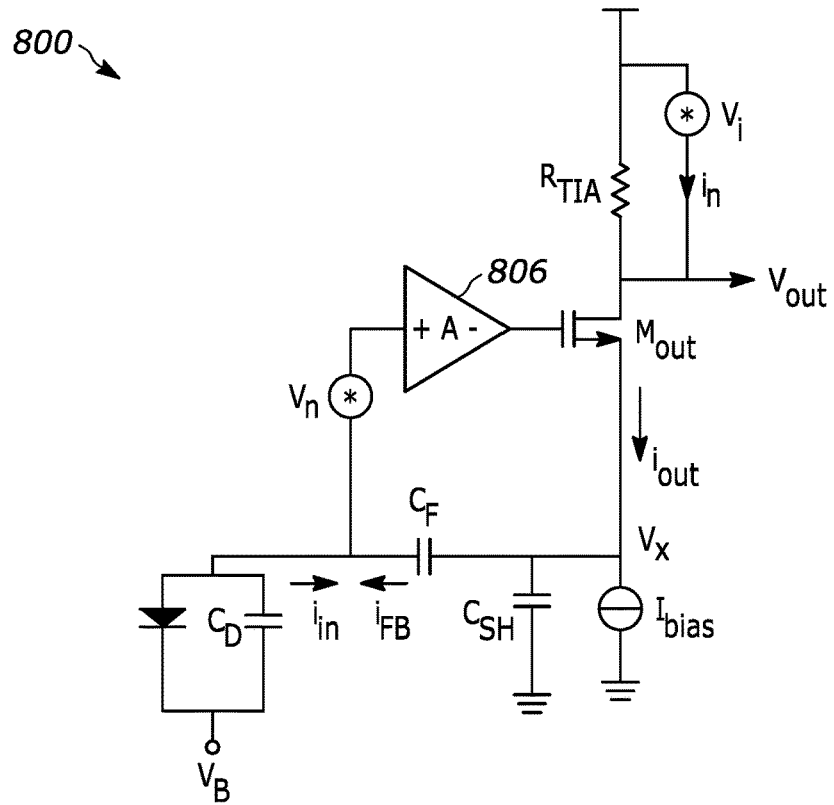
FIG. 8 is a schematic diagram of a capacitive feedback trans-impedance amplifier (TIA).

A promising architecture that effectively tries to break the resistive feedback TIA's coupled stability and BW/noise trade-offs is a TIA with capacitive feedback network as shown in FIG. 8. FIG. 8 is a schematic diagram of a capacitive feedback trans-impedance amplifier (TIA) 800 including a trans-impedance amplifier (TIA) 806. In this topology a shunt feedback capacitor $C_{SH}$ is driven by the output buffer transistor $M_{out}$ to result in a voltage $V_x$ across it. $V_x$ is sensed by feedback capacitor $C_F$ and translated into a feedback current $i_{FB}$ that through the closed loop operation cancels the input current $i_{in}$. The ratio between $C_{SH}$ and $C_F$ results in a gain between the current generated by $M_{out}$ and $i_{FB}$ (and hence $i_{in}$):

$$i_{out} = i_{in} \times \left(1 + \frac{c_{SH}}{c_F}\right) \qquad (6)$$

The prior art then fed the output current produced by the output buffer $M_{out}$ directly into a resistor $R_{TIA}$ to create an output voltage:

$$V_{out} = i_{in} \times \left(1 + \frac{c_{SH}}{c_F}\right) \times R_{TIA} \qquad (7)$$

This topology has several advantages compared to the resistive TIA. The use of a capacitive gain network, means there is no thermal noise penalty like the resistive feedback TIA. The other advantage is that the parasitic capacitance at the input ($C_D$) does not result in instability but rather reduces the in band loop gain and affects bandwidth. Finally, in case of a larger than one current gain of $(1+C_{SH}/C_F)$ the current noise of the trans-impedance resistor $R_{TIA}$ will be reduced by the same gain factor when referring it back to the input. In this architecture we still need to take into account that the amplifier contributes noise through the input capacitance and also the output buffer $M_{out}$ also directly contributes current noise.

The capacitive TIA architecture is promising for the dTOF Lidar as it enables a better trade-off for noise and bandwidth, however, it still has a few shortcomings considering the specific needs of the dTOF link:

The architectures shown by prior-art still have challenges to handle the 4 orders of magnitude signal dynamic range (over >200 m range and 10% to 100% variation of reflectivity).

A voltage output will suffer from limited headroom if the signal is not supposed to be clipped.

Saturation recovery, specifically important for the intensity modulated transmit coding schemes, remains a challenge specifically for the capacitive feedback network (integration characteristics of capacitors).

Handling the large dynamic range requires an efficient quiescent operation as current noise requires low quiescent currents (shortcoming for class A operation).

Less flexibility of these architectures for instance if two functions are to be applied to the Lidar receive signal in current-domain, i.e. a function optimized for TOF estimation and one for estimation of the received signal energy, for instance for reflectivity estimation.

DETAILED DESCRIPTION OF THE INVENTION

The main vision for the proposal of the current-domain analog front-end for intensity modulated direct time-of-flight (dTOF) Lidar applications is creating the capability to have a flexible frontend that enables:

Remaining relatively linear for near 4 orders of magnitude of dynamic range expected for automotive Lidar systems relying on linear photodetectors such as avalanche photodiodes Achieve the required bandwidth and noise performance Have sufficient flexibility to split the signal in such a way that functions optimized for TOF and intensity measurement can be applied to the receive signal Can cope with the DC current induced by the backlight in the photodetector This should help enabling a signal path that overcomes the limitations of the resistive and capacitive TIA topologies described earlier.

Figure 9:
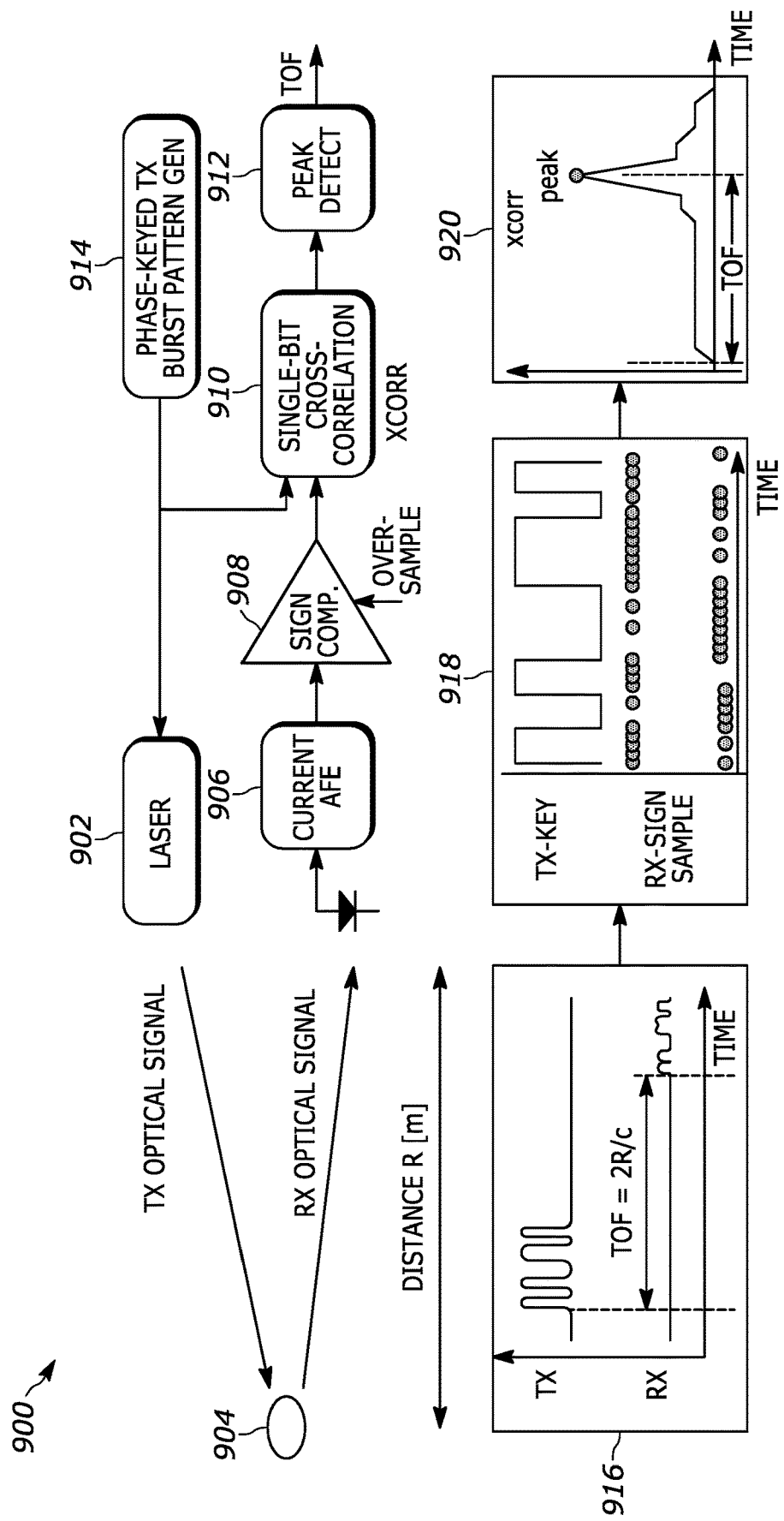
FIG. 9 is a block diagram of an intensity modulated phase coded LIDAR receive path illustrating intermediate signals.

One key application for such circuit is when intensity modulated bursts with embedded coding, such as phase shift keyed bursts are to be used in contrast to the state-of-the-art single pulse transmission schemes similar to that disclosed in PCT/EP2019/052094 and shown in FIG. 9.

FIG. 9 is a block diagram of an intensity modulated phase coded LIDAR receive path 900 illustrating intermediate signals. A laser 902, based on input from a phase-keyed burst pattern generator 914, transmits an optical signal to on object 904 which is then received by a photo detector such as a photodiode. The signal is then amplified by a current AFE 906 and forwarded to a sign comparator 908 then on to a single bit cross correlation block 910 that also receives input from the phase-keyed burst pattern generator 914 and to a peak detection circuit 912 that then outputs a Time of Flight (TOF) signal. The intermediate signals include a transmit and receive amplitude with respect to time 916, a transmit key and receive sign with respect to time 918, and an amplitude with a peak detection with respect to time 920.

The system shown in FIG. 9 is a potential use case where the system could make use of such current-domain analog frontend (Current AFE) to extract the phase coded information out of the receive signal without clipping and hence destroying the phase information. Such modulation allows for instance the use of a highly oversampled single-bit ADC (e.g. a sign comparator) to extract TOF through application of the transmitted phase coded pattern to the output bitstream (a single-bit cross-correlator e.g., application of a matched filter). This is an example where phase coding enables the use of very low resolution ADCs for accurate estimation of TOF. A high level block diagram of the proposed current-domain analog frontend in a potential phase coded direct TOF Lidar architecture is shown in FIG. 10.

Figure 10:
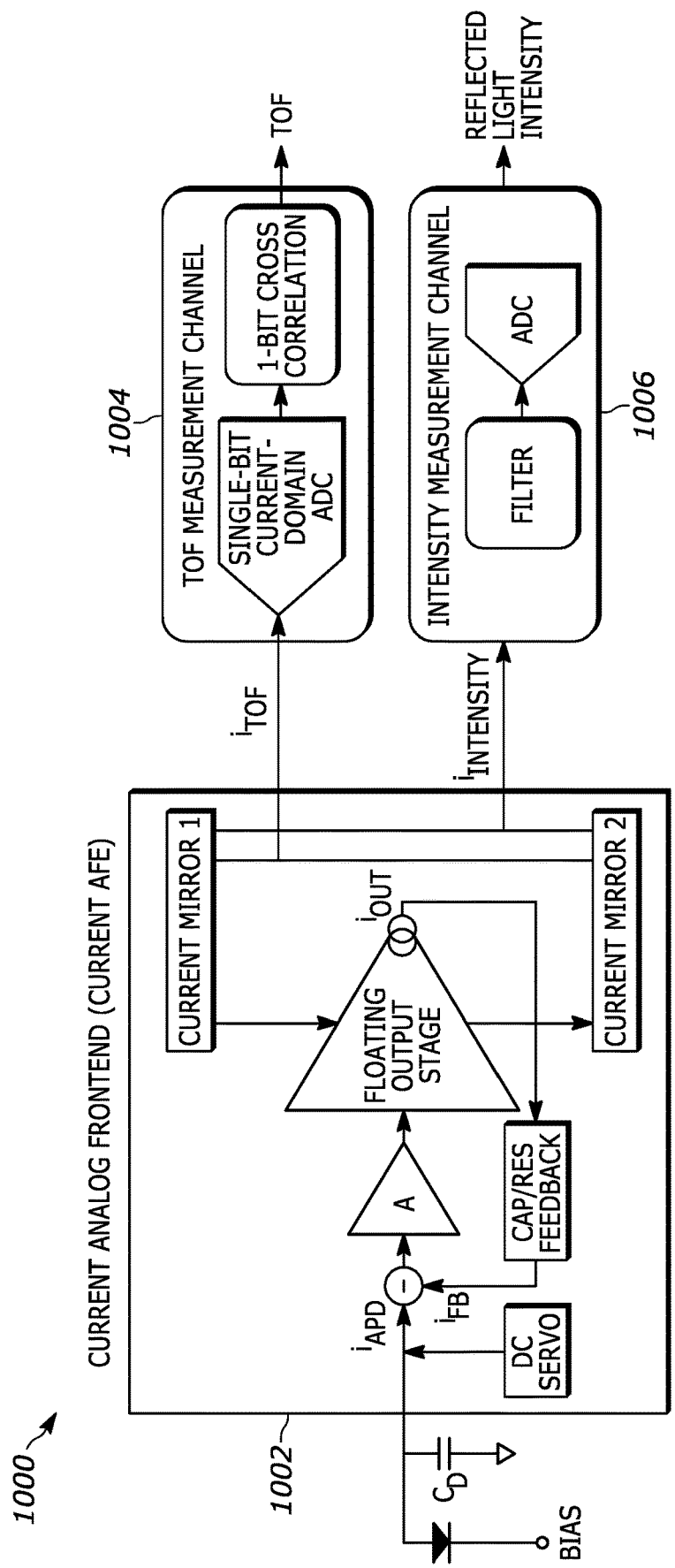
FIG. 10 is block diagram of a current-domain analog frontend (AFE) in a pulse coded LIDAR receive path.

FIG. 10 is block diagram of a current-domain analog frontend (AFE) in a pulse coded LIDAR receive path 1000. A current analog frontend (AFE) receives a signal from a photo detector and outputs a time of flight (TOF) signal to a time of flight measurement circuit 1004 and an intensity signal to an intensity measurement circuit 1006.

As illustrated in FIG. 10, the proposed Lidar current AFE does not make use of the traditional TIA's followed by multi-bit high speed ADC signal path. The current AFE receives the APD current, which in some cases could have an amplitude ranging from 1 uA to 20 mA, superimposed on a back light induced DC current that in some cases could be in the order of 50 uA. The receive signal could involve binary phase coding embedded in an intensity modulated burst of pulses. The current AFE frees the design space from the trade-offs in resistive TIA's where the APD parasitic cap $C_D$ and the modulation period of the transmit signal together with a fixed unity-gain bandwidth of the amplifier put a box around the choice of the signal path BW and hence the feedback resistor, eventually resulting in a compromise for noise and range.

The proposed current AFE's key architectural improvements to the current resistive or capacitive TIA's are as follows:

Current-domain signal path enables processing the required 4 orders of magnitude signal range without clipping, enabling modulations that cannot tolerate saturation.

Signal path noise and dynamic range can be automatically adjusted for low noise or high dynamic range depending on whether the signal is from far end of the range (low noise operation) or near range (high dynamic range operation), respectively.

This is enabled by adopting a non-linear capacitive and resistive feedback network (rather than purely resistive or capacitive). This allows for low noise operation when needed by operating on a capacitive feedback network regime (for mid to far range input signal levels) and when the signal is larger than a certain amplitude a sensing network prevents the frontend from clipping by switching to a resistive feedback network (in this range noise is not a concern).

There are amplitude sensitive mechanisms used in enabling dynamic degeneration of current processing circuits in order to have low noise operation for far range (small signals) and bypass the degeneration circuits for near range large signals in order to prevent clipping.

It utilizes a floating class AB output stage to drive the shunt feedback network, whose output current is then mirrored out for TOF and Intensity measurement channels. The class AB operation enables very low quiescent current operation suitable for low current noise when the signal is from mid to far range (and hence small) and automatic adjustment of quiescent current when the signal is large.

The backlight induced DC current of the APD, if passed to the AFE results in loss of dynamic range and increase of noise due to the increase of quiescent currents. The proposed current AFE utilizes a current feedback DC-servo circuit that compensates for the expected level of back light induced DC currents. This servo loop then creates a high-pass frequency response in the overall AFE frequency response, whose corner frequency can be simply adjusted within the servo loop to the needs of the scanning Lidar system. This can be done without additional noise penalties and has the advantage of freeing the design from the use of external components such as DC block capacitors. This paves the way for multi-channel scaling of the system.

The APD parasitic cap affects the corner frequencies rather than de-stabilizing the signal path The floating class AB output stage's current can be recycled through current mirrors to create parallel signal paths for applying different functions to the received signal. For instance as shown previously this could involve two copies for TOF and Intensity measurement The following sections focus on five main differentiating aspects of the proposed current AFE in more detail. The overall Current-domain AFE's architecture benefits, Signal dependent capacitive/resistive feedback network, Floating class AB output stage with signal dependent degenerated current mirrors, High-speed capacitive-coupled pre-amplifier with bias voltage regulation loop enabling the floating class AB output stage with capacitive feedback (Bias regulation), and Current feedback class AB DC servo loop for back light compensation.

The Overall Current-Domain AFE's Architecture Benefits

Figure 11:
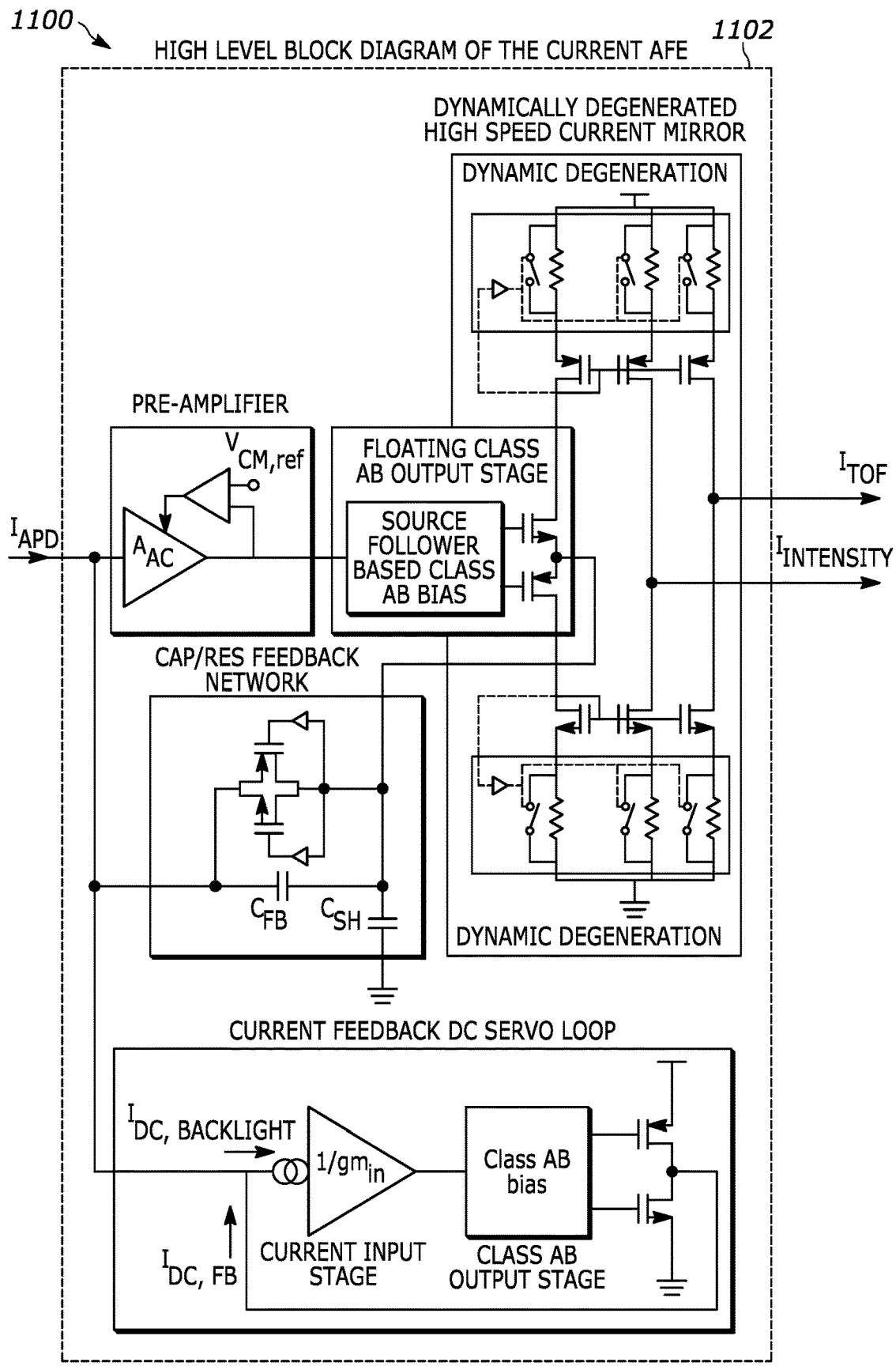
FIG. 11 is schematic diagram of a current-domain analog frontend (AFE).

The more detailed block diagram of the current-domain AFE is shown in FIG. 11. The various blocks of the architecture will be discussed in more detail in the following sub-sections.

FIG. 11 is schematic diagram of a current-domain analog frontend (AFE) 1100, 1102. The current AFE is made of an AC signal path and a DC servo loop in which the AC signal path is comprised of a pre-amplifier (input stage) that drives a floating class AB output stage made of a source follower based bias circuit. This structure enables a controlled setting of the output DC level, which allows for the use of capacitive feedback network.

The output current of the output stage drives the capacitive/resistive feedback network, which is mainly capacitive for low noise operation when processing mid to long range signals and resistive for short range operation, where dynamic range is the main concern. Feedback closes in current-domain at the input to cancel the current from the APD photo detector. The feedback network senses the output swing and transitions from capacitive to resistive network automatically. The potential glitch or distortions caused by this cross-over are of minimal concern for the Lidar application, as cross correlation applied to the phase coded modulation (or single-pulse) is robust to such non-idealities.

The feedback current generated by the floating class AB output stage is sensed and copied by means of a dynamically degenerated output current mirror for the current signal copies to be used by various functions in the rest of the signal path such TOF or intensity measurements. Dynamic degeneration enables low-noise and broadband operation for the mid to far range signals at low-quiescent current levels.

A path to scaling the AFE is by enabling the interface to multiple photodetectors, for example in order to scale a dTOF Lidar's spatial resolution through partial flash operation. This requires a higher level of integration, for which a DC Servo loop is proposed that compensates for the backlight induced APD current. Due to some potential requirements associated with the Lidar scan rate, the back light current compensation might have to provide a fast settling capability for when the Lidar scans from a very reflective pixel to a non-reflective pixel. The DC servo loop has a current-buffer input stage that drives a class AB output stage with a unity current-domain feedback. Its low-pass frequency response creates the overall current AFE's bandpass frequency response by determining its high-pass corner. Class AB, low-quiescent current current-feedback architecture enables low-noise operation. The BW can be adjusted to the system needs to cover high pas corners that allow fast settling for the back light current compensation.

Figure 12:
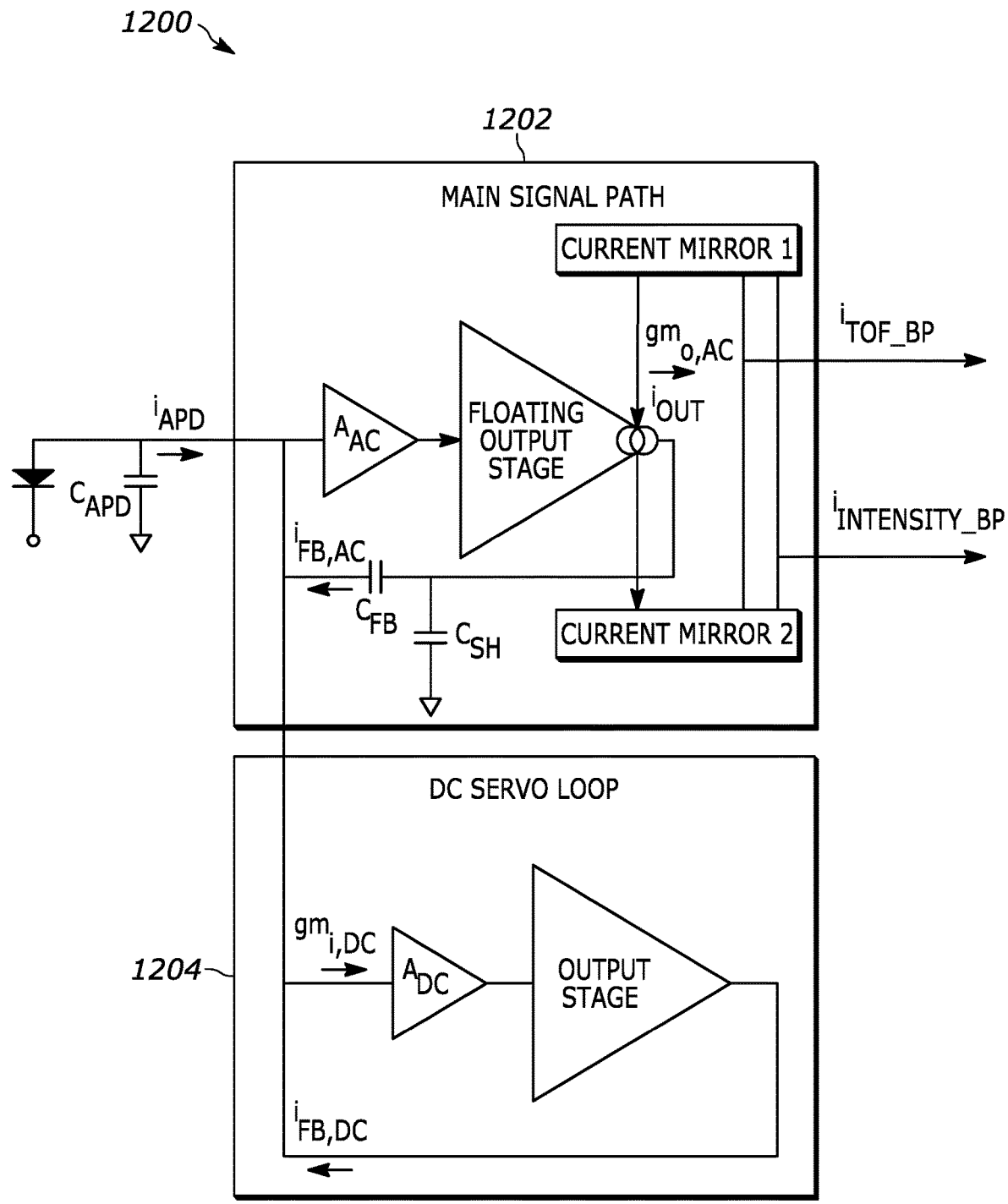
FIG. 12 is a block diagram of current-domain analog frontend (AFE).

Neglecting most secondary effects, the small signal frequency response of the current-domain AFE can be designed to first order by considering the contributing circuit parameters shown in the simplified block diagram of FIG. 12. This includes:

The AC signal path parameters including the pre-amplifier in-band gain: $A_{AC}$, the floating output stage effective gm: $gm_{o,AC}$, the capacitive feedback network values: $C_{SH}$ and $C_{FB}$, the parasitic capacitance of the APD: $C_{APD}$ The DC servo loop parameters including the DC servo loop forward path gain: $A_{DC}$, the input trans-impedance of its current domain input stage, $gm_{i,DC}$.

FIG. 12 is block diagram of a small signal current-domain analog frontend (AFE) 1200 including a main signal path circuit 1202 and a DC servo loop 1204. The corner frequencies of the closed loop transfer functions will be proportional to:

$$f_{LP} \propto \frac{gm_{o,AC} \times A_{AC}}{c_{SH} + \frac{c_{FB} \times c_{APD}}{c_{FB} + c_{APD}}} \quad (8)$$

$$f_{HP} \propto \frac{gm_{i,DC} \times A_{DC}}{c_{FB} \times A_{AC}} \quad (9)$$

The closed loop in-band current transfer gain will be $A_I = I_{out}/I_{in} = 1 + C_{SH}/C_{FB}$, which for example in some particular implementations could be set to ~1 by having $C_{SH} < 0.1$ $C_{FB}$.

The high pass corner, $f_{HP}$, of the AFE is determined by two elements:
The input impedance of the DC servo loop divided by its loop gain, e.g. the input DC resistance
The feedback capacitor of the AC loop times the AC loop gain, e.g. the Miller effect applied to the $C_{FB}$ due to gain, which is the dominant load capacitance for the DC servo loop.

The low pass corner, $f_{LP}$, of the AFE is determined by two elements:
The transconductance of the AC loop's class AB output driver ($gm_{o,AC}$) divided by the AC loop gain (determining the output impedance of the closed loop amplifier
The shunt feedback capacitor $C_{SH}$ plus the series connection of $C_{FB}$ and $C_{APD}$ and $C_P$ determining its dominant capacitive load It should be noted that the BW of the pre-amplifier in the main AC loop needs to be at least $2 \times f_{LP}$ in order not to introduce a non-dominant pole.

The parasitic $C_{APD}$ should still be kept minimum for accuracy of the bandwidth implementation, i.e. $C_{APD} < 0.1 * C_{FB}$, so that $C_{SH}$ will mainly determine the capacitance contributing to $f_{LP}$. It is preferred to keep $C_{SH}$ small, to increase bandwidth but now $C_{SH}$ compares with $C_{APD}$.

Summary of the overall benefits of the current domain AFE that enable various benefits at the Lidar system architecture:

High dynamic range operation.
Dynamic feedback network including Capacitive feedback for low-noise for mid to far range signals and Switching to low resistance (or current buffer) for large signals that can help prevent clipping.
Dynamic transistor source degeneration enables low-noise and no-clip current mirrors.
Floating class AB output stage enables dynamic behavior where low quiescent current enables low noise and high drive capability enables large signal behavior.

Back light compensation.
No external components to block DC enables scaling.
Class AB current feedback servo loop enables low-noise operation.
High pass frequency response adjustable for Lidar scan rate to enable fast reaction to back light induced amplitude→Scanning from dark pixel to light pixel.
Parasitic input capacitance does not disturb stability (only affects corner frequencies and still has noise penalty through the pre-amplifier noise performance.

Splitting signal paths for different functions.
Separate TOF and intensity signal paths each optimized for their own requirements (frequency response, speed, dynamic range).
Both sink and source capability of the entire current AFE (bipolar APD connection).

Signal Dependent Capacitive/Resistive Feedback Network

In the case of single-pulse dTOF Lidar systems using resistive or capacitive TIA's large input signals saturate the front-end and hence there is a need for a reset to recover for the next measurement shot.

Figure 13:
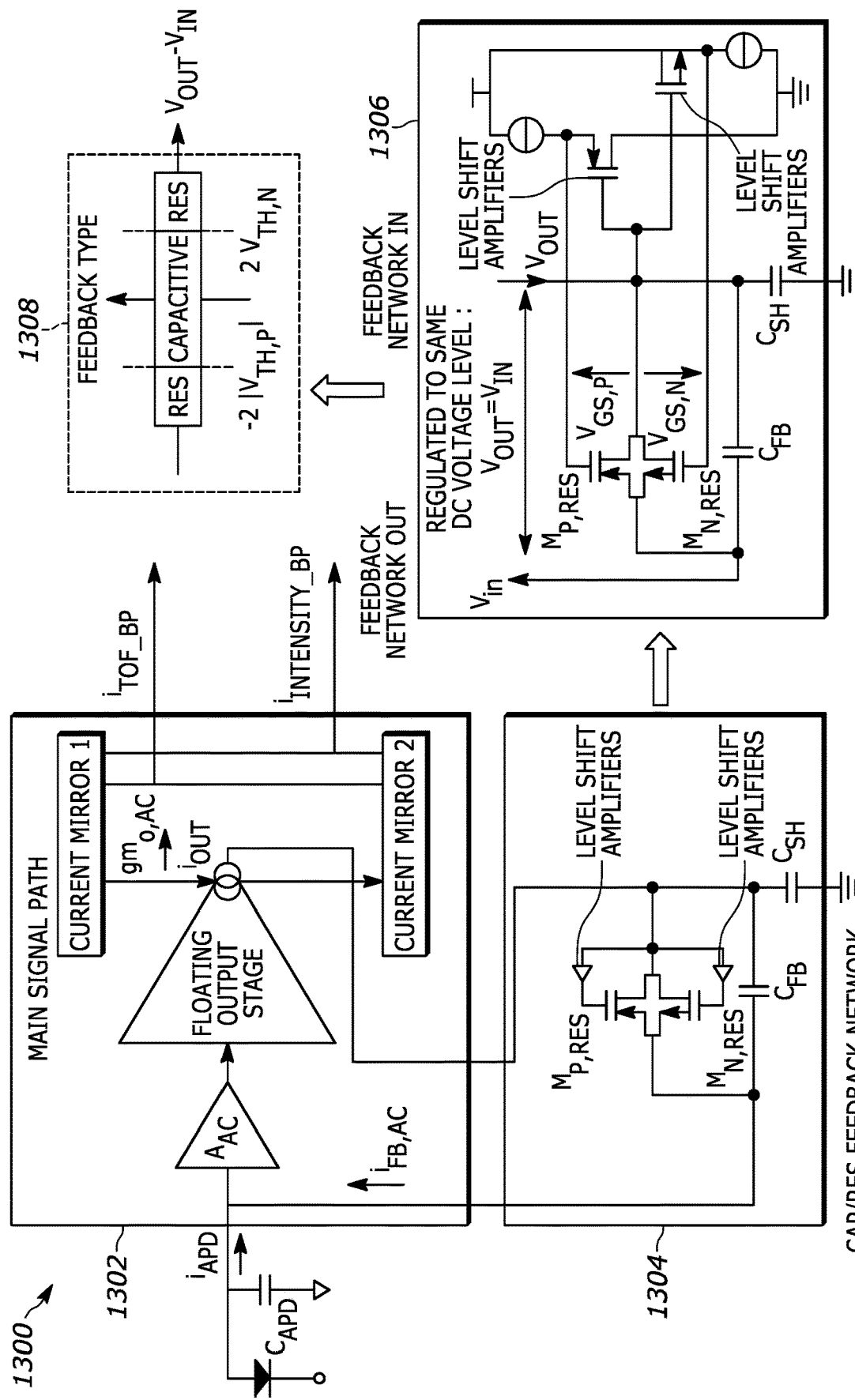
FIG. 13 is schematic diagram of a floating signal dependent capacitive/resistive feedback network.

This application discloses a signal dependent feedback network to be used with a current-domain signal path. The network can automatically switch between a capacitive network that is designed for low-noise operation needed for small signals (far distance from 20 m to 200 m) with no noise penalty and switch to a resistive based feedback network in order to prevent saturation for large signals of from 2 m to 20 m (naturally noise is negligible for detection of such large signals). FIG. 13 illustrates one embodiment of such network for the signal dependent control of the feedback network. This is implemented by sensing the voltage at the output of the floating class AB output stage (Feedback network's input terminal) and using level shift amplifiers to drive the gates of a parallel connected PMOS and NMOS pair $M_{N,RES}$ and $M_{P,RES}$ transistors such that they bypass the feedback capacitor $C_{FB}$ when a certain voltage swing is sensed at the amplifier output (designed through the level shift parameter and the threshold voltage of $M_{N,RES}$ and $M_{P,RES}$).

FIG. 13 is schematic diagram of a signal dependent capacitive/resistive feedback network 1300 that includes a Main signal path circuit 1302 and a capacitance/resistance feedback network 1304. In FIG. 13, an alternative capacitance/resistance feedback network 1306 is illustrate with a specific implementation of the level shift amplifiers that provides a feedback type 1308.

When the signal is small, the level shifters together with the DC voltage regulation of the feedback network input and output nodes (from the amplifier internal nodes) ensure the bypass transistors $M_{N,RES}$ and $M_{P,RES}$ are turned off (each is provided effectively with a negative $|V_{GS}|$ in this situation). In this condition, the feedback network is capacitive. For large Lidar return signals, during the rising edge of the first pulse, the capacitive network results in an integrating voltage at the amplifier output. This results in a net voltage across the feedback capacitor $C_{FB}$. Depending on the sink or source nature of the input current signal, when the voltage difference across $C_{FB}$ becomes larger than two threshold voltages the either of the bypass paths through $M_{N,res}$ or $M_{P,res}$ will be enabled. When the voltage difference across $C_{FB}$ is positive by two NMOS threshold voltages, then the $M_{N,res}$ path gets enabled through the source follower $M_{N,B}$ and when the voltage difference is negative by two PMOS threshold voltages, then the $M_{P,res}$ path gets enabled through the source follower $M_{P,B}$. Either of these scenarios as shown by FIG. 10 allows for a pre-determined signal swing for which the feedback network is capacitive and for swings larger than (toward positive or negative values) the capacitor is bypassed by the resistive network formed by either $M_{N,res}$ or $M_{P,res}$. There will be gain difference between the two feedback networks, however this is of almost no significance for TOF evaluation and for intensity (energy of the reflected signal) a calibration might be required.

One potential application of the current AFE is to be used as a current buffer and current copier (i.e. a factor 10$x$ difference between $C_{SH}$ and $C_{FB}$ values) in which case the gain variation is irrelevant as the $M_{N,RES}$ and $M_{P,RES}$ channel resistance can be simply made much smaller than the impedance of $C_{SH}$ to maintain the unity gain transfer characteristic between the capacitive and resistive modes.

Floating Class AB Output Stage with Signal Dependent Degenerated Current Mirrors The output stage of the current AFE performs functions including:
- Creates a source-follower based class-AB driver, which can: 1). Self-regulate the DC bias at the output node and drive the feedback current into the capacitive/resistive feedback network. DC regulation is important in both modes of operation of the feedback network and 2) while in Class AB operation, enable the 4 orders of magnitude current handling capability while at small quiescent current (IQ) levels that is important for low-noise operation for mid to far range receive signals.
- The sink/source output current capability allows both sinking and sourcing connection of photo-detectors.
- The sink/source feedback current injected by the class AB output stage (sunk from the supply rail or sourced into the ground rail) is being recycled by a dynamically degenerated current mirror in order to create the desired number of copies of the output current for various signal paths, e.g. for TOF and intensity detection paths.

Figure 14:
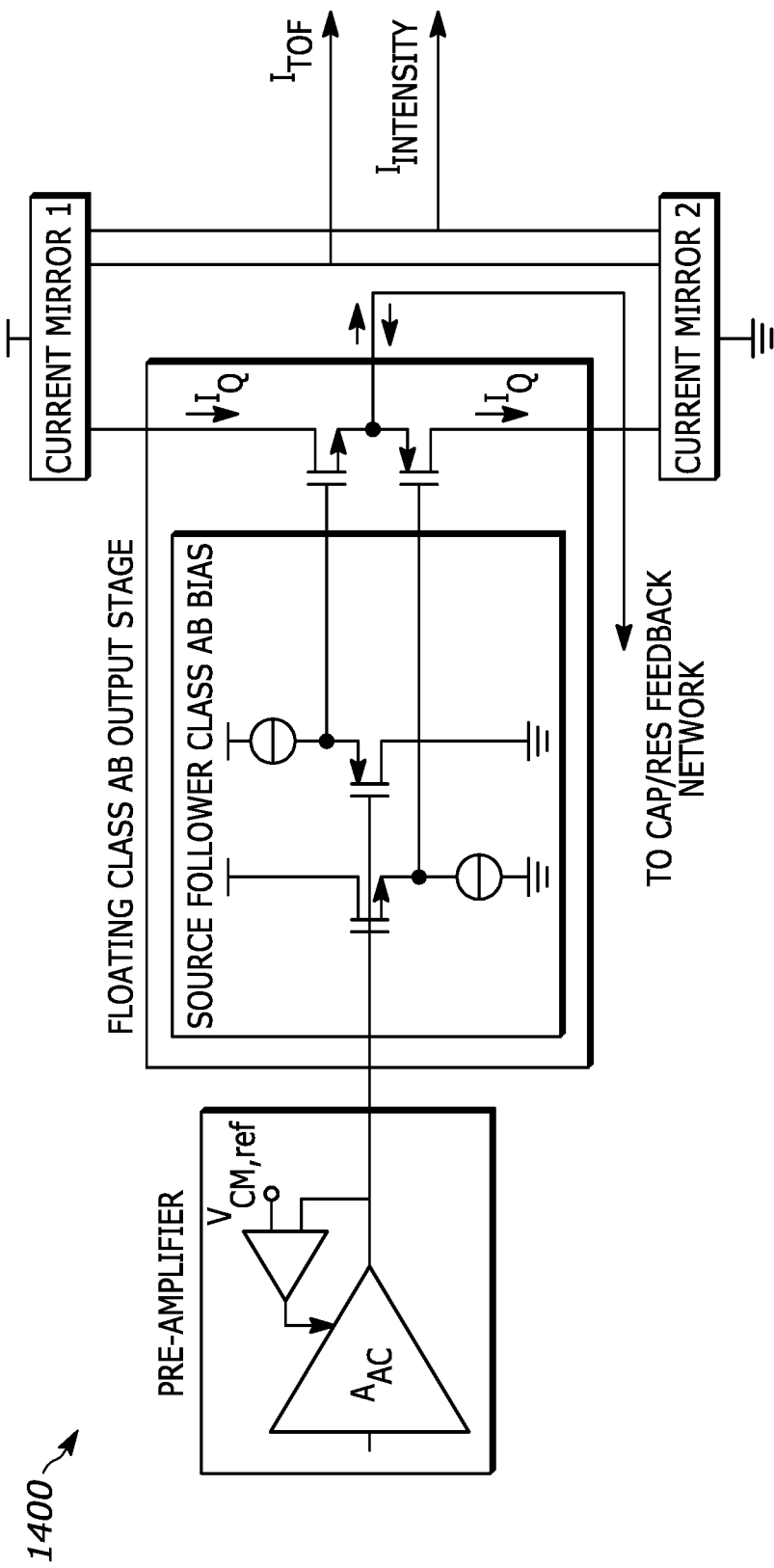
FIG. 14 is schematic diagram of a class AB output stage with a source-follower bias network.

FIG. 14 is schematic diagram of a class AB output stage with a source-follower bias network 1400 illustrating the source follower based class AB biasing and the output transistors. The source follower configuration (in contrast to common-source output device configuration) has the drawback of limited voltage swing, however, it allows regulating the output DC bias, which is required when using a capacitive feedback network. Limitation on voltage swing is not an issue here as the signal path is in current domain and the swing is kept limited through the signal dependent capacitive/resistive feedback network to prevent saturation. This configuration enables a high speed and low-noise solution rather than the use of common-mode regulation techniques at the output stage. To bias the class-AB driver the pre-amplifier of the current AFE will incorporate an output DC bias regulation (discussed later).

Figure 15:
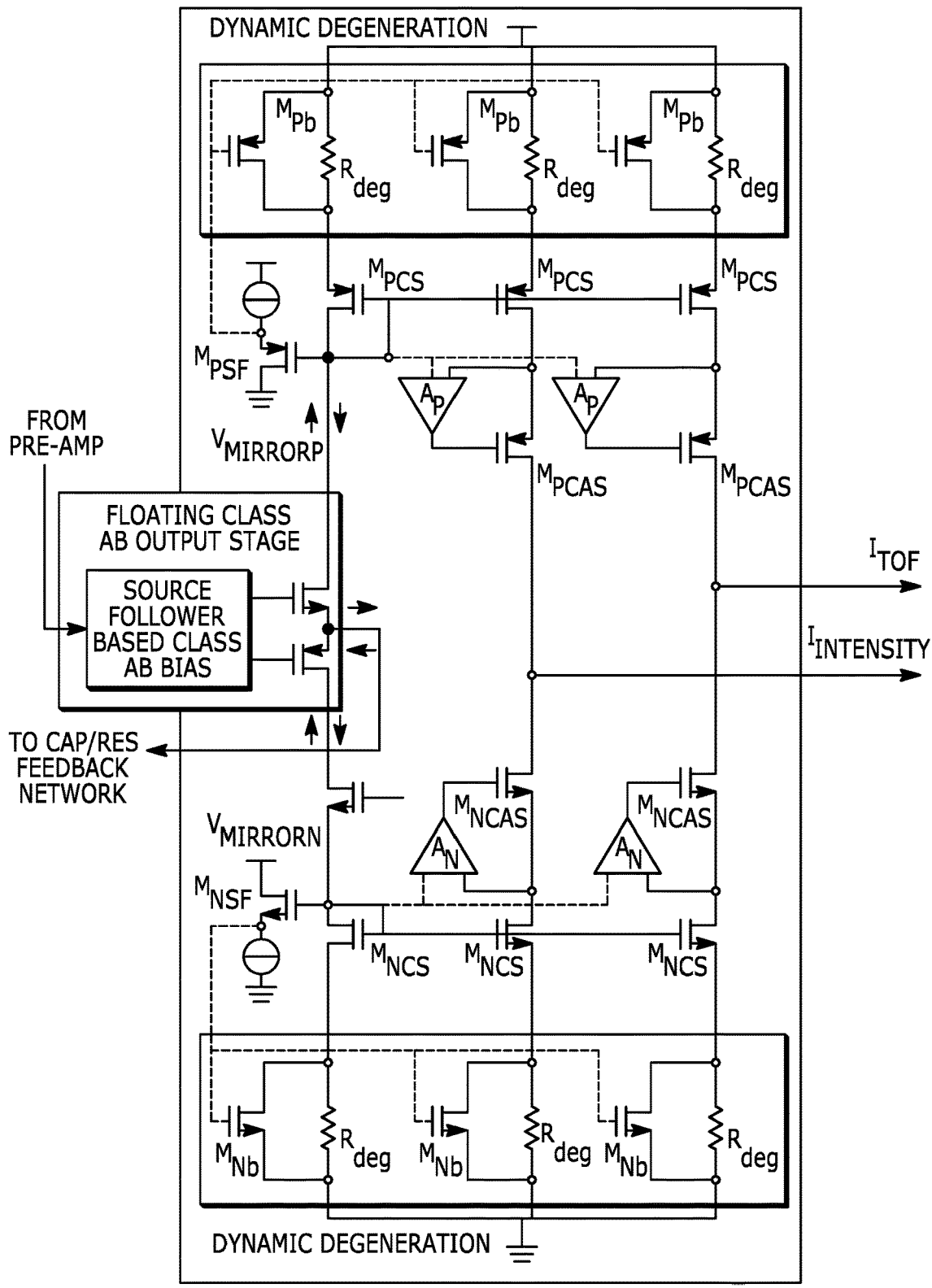
FIG. 15 is a schematic diagram of a dynamically degenerated high speed current mirror.

FIG. 15 is a schematic diagram of a dynamically degenerated high speed current mirror 1500 that illustrates the dynamically degenerated low-noise and high dynamic range current mirror that recycles and copies the floating class AB output stage's current that is injected into the capacitive/resistive feedback network. Here the mirror transistors $M_{NCS}$ and $M_{PCS}$ are degenerated by degeneration resistors $R_{deg}$. The degeneration has various benefits for the accuracy and noise performance of the current mirror, however, it comes at the cost of excess voltage headroom requirement for large signals, which quickly becomes impractical when the current mirror has to handle a wide dynamic range.

For a dTOF Lidar signal path, specifically when thinking about alternative modulations schemes such as phase coding in intensity modulated bursts, the mid to far range receive signals have the most stringent requirements on the noise and offset. For short to mid-range signals, where the signals are larger than noise level, these requirements do not hold. In those ranges of input signal it is rather important that the circuit does not clip so that the phase information embedded in the burst can be retrieved.

With the above considerations, one can think of adapting the circuit to the needs of the signal. This means that we can think of a dynamically degenerated current mirror, where the benefits of degeneration resistors are present for small signals. In those ranges, we care for low-offset and low-noise operation. Once the signal gets large, the voltage built on mirror points $V_{mirrorP}$ and $V_{mirrorN}$ become large enough such that the source follower based level shifter buffers $M_{NSF}$ and MPSF can turn on the bypass transistors $M_{Nb}$ and $M_{Pb}$ and hence bypass the degeneration resistors $R_{deg}$. This way the bypassing mechanism for the degeneration can be designed to approximately apply the degeneration for signals from 20 m to 200 m and bypass it for signals from distances shorter than 20 m.

Furthermore, in order to further enhance the accuracy of the mid to far range signal levels, cascode transistors $M_{PCAS}$ and $M_{NCAS}$ with regulating amplifiers $A_P$ and $A_N$ ensure that the drain-source voltage of the mirror transistors MNCS and MPCS remain the same (equal to the $V_{mirrorP}$ and $V_{mirrorN}$) significantly enhancing their output impedances.

Summarizing the current mirror: it recycles the output current of the floating class AB output stage (low noise+high dynamic range capabilities combined) and mirrors it with precision (low-noise and low-offset) for mid to far range signals and with dynamic range (no clipping) for near range signals.

High-Speed Capacitive-Coupled Pre-Amplifier with Bias Voltage Regulation Loop Enabling the Floating Class AB Output Stage with Capacitive Feedback (Bias Regulation)

The single transistor pre-amplifier of the current AFE drives the floating class AB output stage. It is optimized for speed and noise. Its bandwidth should be a few times (minimum 2×) larger than the current AFE's bandwidth such that it does not affect the frontend's stability. Its noise performance should also be designed according to the desired input noise requirements of the current AFE, considering the expected parasitic capacitance of the photodetector (APD).

Figure 16:
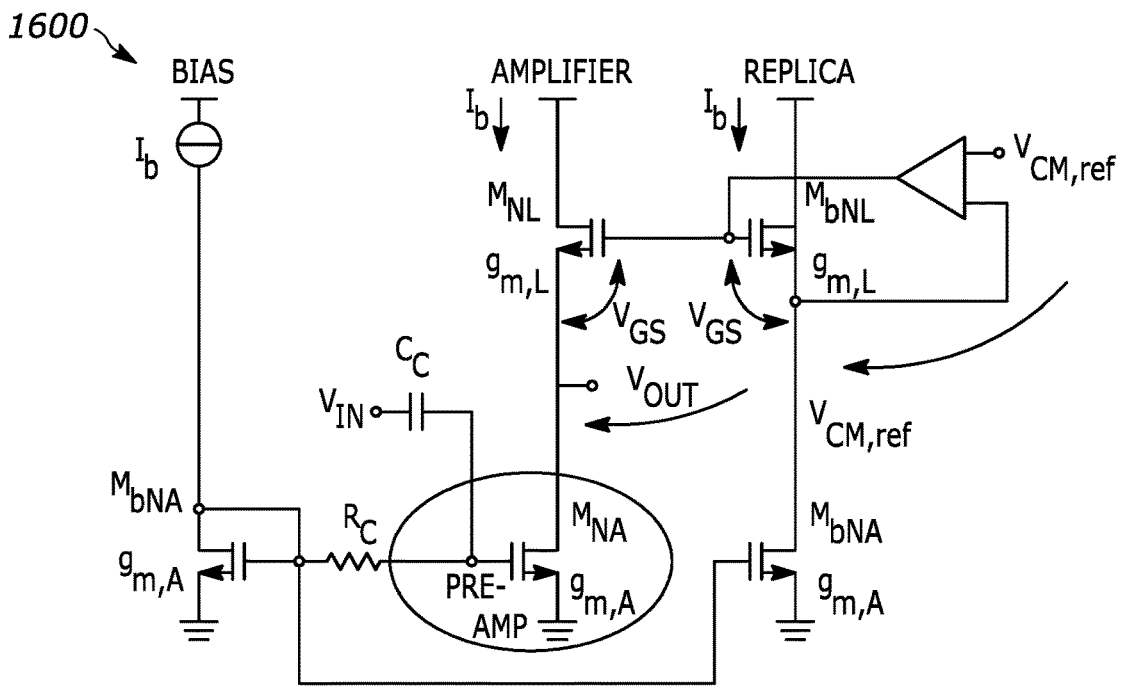
FIG. 16 is a schematic diagram of a pre-amplifier of a current-domain analog frontend (AFE) including bias and common-mode regulation circuits.

A closed-loop regulation of its output bias point, allows biasing the front-end's output stage DC bias that is required due to the use of capacitive feedback network. The preamplifier is shown in FIG. 16. FIG. 16 is a schematic diagram of a pre-amplifier of a current-domain analog frontend (AFE) including bias and common-mode regulation circuits 1600.

The pre-amplifier is formed by transistor $M_{NA}$ as the common-source amplifier and a load transistor $M_{NL}$ which have trans-conductances $g_{m,A}$ and $g_{m,L}$, respectively. The input to output gain of the amplifier is determined by:

$$A_{pre-amp} = \frac{g_{m,A}}{g_{m,L}} \tag{10}$$

The amplifier transistor is biased from the bias branch on the left side (transistor $M_{bNA}$), which also biases the replica branch on the right side (made of $M_{bNA}$ and $M_{bNL}$). The replica branch uses the same current density and aspect ratio transistors as the ones in the amplifier branch (and the bias branch). A feedback loop regulates the gate of the load transistors ($M_{NL}$ and $M_{bNL}$) such that the source of the load transistor in the replica branch is regulated to the desired $V_{CM,ref}$ (this will be the DC level at the input and hence the output of the floating class AB output stage). Since the transistors match, the source of the load transistor in the amplifier branch (and hence the $V_{out}$ DC level), will be equal to that of the replica branch, which was regulated to $V_{CM,ref}$. Variations due to mismatch between the branches are not critical as this slightly moves the bias point, which given the current AFE's current-input, current-output topology, does not cause headroom and swing issues, which are typical issues of TIA circuitry.

The input is coupled capacitively through capacitor $C_C$, which through resistor $R_C$ is designed to have a cross-over frequency much lower than the overall current-amplifier's high-pass corner in order not to interfere with its frequency response. To achieve this, the resistor $R_C$ can be made large.

Current Feedback Class AB DC Servo Loop for Back Light Compensation

Figure 17:
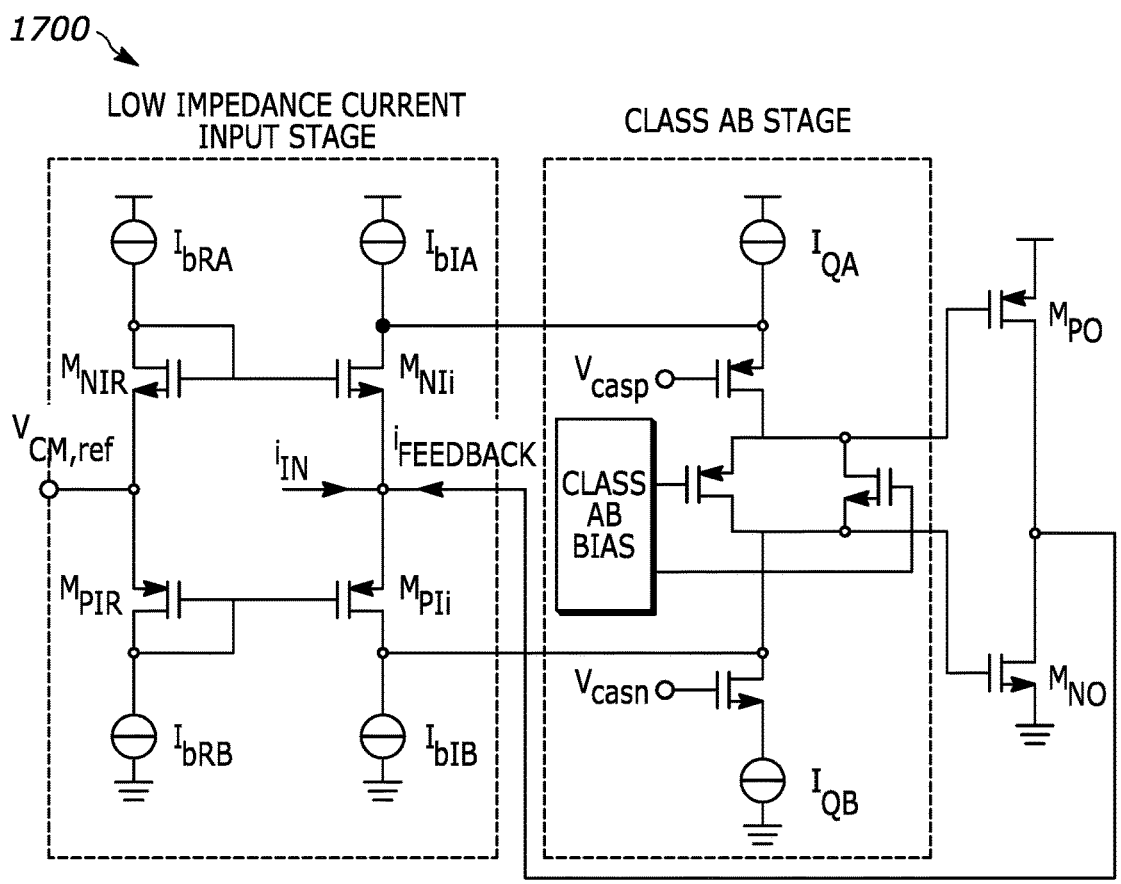
FIG. 17 is a schematic diagram of a DC servo loop with a current feedback class AB current conveyor.

The DC servo loop is a current-feedback current-input and current-output circuit that has a few key features for the dTOF Lidar system and the overall current AFE operation:
  Allows for an integrated solution more amenable for scaling with more detectors (rather than the use of off-chip DC block capacitors).
  Absorbs the back-light induced DC current produced by the photodetector (APD) and therefore, increases the signal path's dynamic range, reduces the excess noise in the current AFE (current noise increases when quiescent currents increase, e.g. due to processing the DC back light induced current)
  Its low-pass frequency response creates an overall band-pass frequency response for the current AFE. The high corner frequency achieved by this function can be designed such that the DC servo loop settles for the maximum expected back light induced DC current within the short time period available between two adjacent pixels that are being scanned by the Lidar (the target reflectivity could cause full dynamic range excursion of the DC back light)
  Provides DC bias voltage for the front-end
The circuit architecture is based on previously proposed current conveyors, however, this embodiment has some new features that are specifically critical for the needs of a Lidar signal, path:
  Combining a current input stage that drives a class-AB biased output stage to drive the unity feedback path (also self-regulating the DC bias at the output).
  Allowing for low-quiescent current operation for combined low noise and high dynamic range operation to be able to cancel a large range of DC currents at minimum noise impact to the current AFE.
FIG. 17 is a schematic diagram of a DC servo loop with a current feedback class AB current conveyor 1700. The input stage is formed by the mesh of the PMOS and NMOS transistors $M_{NI}$ and $M_{PI}$, where the input and feedback current are summed at one point on the right branch. The left branch connected to a reference voltage regulates the DC bias point of the input/output terminal (and eventually through the unity current feedback the DC bias of the output transistors as well). The output sink/source current of the input stage is passed to the output stage which is a class AB mesh driving the class AB biased output stage transistors $M_{PO}$ and $M_{NO}$. The feedback is unity and hence made by making a short from the output to the input and as a result the generated feedback current $i_{Feedback}$, compensates the input DC current generated by the back light. The frequency response of this stage, determining the overall signal path's high-pass corner was discussed in the overall current AFE discussion. The low-pass corner formed by it defines the high-pass corner frequency of the current AFE.

The program code embodying the algorithms and/or methodologies described herein is capable of being individually or collectively distributed as a program product in a variety of different forms. The program code may be distributed using a computer readable storage medium having computer readable program instructions thereon for causing a processor to carry out aspects of one or more embodiments. Computer readable storage media, which is inherently non-transitory, may include volatile and non-volatile, and removable and non-removable tangible media implemented in any method or technology for storage of information, such as computer-readable instructions, data structures, program modules, or other data. Computer readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. Computer readable program instructions may be downloaded to a computer, another type of programmable data processing apparatus, or another device from a computer readable storage medium or to an external computer or external storage device via a network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions, acts, and/or operations specified in the flowcharts or diagrams. In certain alternative embodiments, the functions, acts, and/or operations specified in the flowcharts and diagrams may be re-ordered, processed serially, and/or processed concurrently consistent with one or more embodiments. Moreover, any of the flowcharts and/or diagrams may include more or fewer nodes or blocks than those illustrated consistent with one or more embodiments.

While all of the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the general inventive concept.

What is claimed is:

1. A current-domain analog frontend (AFE) circuit for a LIDAR system comprising:
   a photo detector configured to source a current;
   a current feedback DC servo loop configured to cancel a DC component of the current;
   a feedback network configured to cancel an AC component of the current;
   a floating class AB output stage that drives the feedback network; and
   a preamplifier configured to drive the floating class AB output stage, wherein the preamplifer is driven by an error signal of the feedback network and creates an AC signal path with the feedback network and floating class AB output stage, wherein the current feedback DC servo loop sets a frequency response of an AC signal path at a high pass frequency corner that is based on an input impedance of the current feedback DC servo loop with a low pass frequency corner that is based on a transconductance of the floating class AB output stage.

2. The circuit of claim 1, wherein the floating class AB output stage includes a dynamically degenerated current mirror.

3. The circuit of claim 1, wherein the feedback network includes switches coupled between an input and output of the floating class AB output stage.

4. The circuit of claim 3, wherein, in response to an absolute value of an output of the floating class AB output stage exceeding twice a threshold voltage of level shift switches of the feedback network, the feedback network is configured to transition from capacitive operation to resistive operation based on a resistive channel of the switches controlled by the level shift switches.

5. That circuit of claim 1, wherein the preamplifier includes a bias voltage regulation loop that sets an input bias voltage for the floating class AB output stage.

6. The circuit of claim 1, wherein the photo detector is an avalanche photo diode.

7. The circuit of claim 6, wherein the error signal is based on an output current of the avalanche photo diode ($I_{APD}$) reduced by an output current of the feedback network ($I_{FB,AC}$).

8. A method of operating a LIDAR system comprising:
   sourcing a current via a photo detector;
   canceling a DC component of the current via a current feedback DC servo loop;
   canceling an AC component of the current via a feedback network;
   driving the feedback network via a floating class AB output stage;
   driving the floating class AB output stage via a preamplifier, wherein the preamplifier is driven by an error signal of the feedback network; and
   setting, by the current feedback DC servo loop, a frequency response of an AC signal path at a high pass frequency corner that is based on an input impedance of the current feedback DC servo loop with a low pass frequency corner that is based on a transconductance of the floating class AB output stage.

9. The method of claim 8, wherein the feedback network includes switches coupled between an input and output of the floating class AB output stage.

10. The method of claim 9 further comprising, in response to an absolute value of an output of the floating class AB output stage exceeding twice a threshold voltage of level shift switches of the feedback network, configuring the feedback network to transition from capacitive operation to resistive operation based on a resistive channel of the switches controlled by the level shift switches.

11. That method of claim 8, wherein the preamplifier includes a bias voltage regulation loop that sets an input bias voltage for the floating class AB output stage.

12. The method of claim 8, wherein the floating class AB output stage includes a dynamically degenerated current mirror.

13. The method of claim 8, wherein the photo detector is an avalanche photo diode.

14. The method of claim 13, wherein the error signal is based on an output current of the avalanche photo diode ($I_{APD}$) reduced by an output current of the feedback network ($I_{FB,AC}$).

15. A circuit for filtering a signal corresponding to a time of flight (TOF) of light from a laser reflected off an object to a photo detector, the circuit comprising:
   a preamplifier configured to receive the signal from the photo detector corresponding to an output of the laser reflected off an object remote from the laser and photo detector;
   a DC cancelation loop that includes a current feedback DC servo loop; and
   an AC cancelation loop that includes a feedback network driven by a floating class AB output stage, and the preamplifier configured to drive the floating class AB output stage,
      wherein the preamplifier is driven by an error signal of the feedback network and creates an AC signal path with the feedback network and floating class AB output stage.

16. The circuit of claim 15, wherein the feedback network includes switches coupled between an input and output of the floating class AB output stage.

17. The circuit of claim 16, wherein, in response to an absolute value of an output of the floating class AB output stage exceeding twice a threshold voltage of level shift switches of the feedback network, the feedback network is configured to transition from capacitive operation to resistive operation based on a resistive channel of the switches controlled by the level shift switches.

18. That circuit of claim 15, wherein the preamplifier includes a bias voltage regulation loop that sets an input bias voltage for the floating class AB output stage.

* * * * *